(12) United States Patent
Huang et al.

(10) Patent No.: US 10,037,945 B2
(45) Date of Patent: Jul. 31, 2018

(54) PACKAGE STRUCTURE AND THREE DIMENSIONAL PACKAGE STRUCTURE

(71) Applicant: WIN Semiconductors Corp., Tao Yuan (TW)

(72) Inventors: Chih-Wen Huang, Taoyuan (TW); Jui-Chieh Chiu, Taoyuan (TW); Fan-Hsiu Huang, New Taipei (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/860,723

(22) Filed: Sep. 22, 2015

(65) Prior Publication Data

US 2016/0343653 A1   Nov. 24, 2016

(30) Foreign Application Priority Data

May 21, 2015   (TW) .............................. 104116183 A

(51) Int. Cl.
*H01L 23/02* (2006.01)
*H01L 23/538* (2006.01)
(Continued)

(52) U.S. Cl.
CPC ...... *H01L 23/5384* (2013.01); *H01L 23/3121* (2013.01); *H01L 23/481* (2013.01); *H01L 23/49827* (2013.01); *H01L 23/66* (2013.01); *H01L 25/0657* (2013.01); *H01L 23/49822* (2013.01); *H01L 2224/48091* (2013.01);
(Continued)

(58) Field of Classification Search
CPC ......... H01L 23/49861; H01L 23/49838; H01L 23/49827; H01L 25/0657; H01L 23/315; H01L 23/49811; H01L 2225/06544; H01L 23/481; H01L 23/49816; H01L 23/3121; H01L 23/49822; H01L 23/5384; H01L 23/3735
USPC .......................... 257/686, 777, 774, 621, 698
See application file for complete search history.

(56) References Cited

U.S. PATENT DOCUMENTS 6,577,013 B1 *  6/2003  Glenn ................. H01L 23/3114
                                                  257/618
7,795,139 B2 *  9/2010  Han ................... H01L 21/76898
                                                  257/E23.067
(Continued)

FOREIGN PATENT DOCUMENTS

CN        101471317 A     7/2009
CN        102420180 A     4/2012
(Continued)

OTHER PUBLICATIONS

Liam Devlin, "The Future of mm-wave Packaging," Microwave Journal 57(2):24-38,pp. 1-2,7 ,Feb. 2014.

*Primary Examiner* — Shouxiang Hu
(74) *Attorney, Agent, or Firm* — Winston Hsu

(57) ABSTRACT

A package structure is disclosed. The package structure includes at least a lead, for delivering at least a signal; at least a routing layer, connected to the at least a lead, where at least a first hole is formed through the at least a routing layer; a die, disposed on the at least a routing layer, where at least a second hole is formed through the die, and the die generates or receives the at least a signal; and a molding cap, for covering the at least a routing layer and the die; where the at least a signal is delivered through the at least a first hole and the at least a second hole.

10 Claims, 5 Drawing Sheets

(51) Int. Cl.
  *H01L 23/498*   (2006.01)
  *H01L 25/065*   (2006.01)
  *H01L 23/48*    (2006.01)
  *H01L 23/31*    (2006.01)
  *H01L 23/66*    (2006.01)

(52) U.S. Cl.
  CPC .............. *H01L 2225/06544* (2013.01); *H01L 2924/181* (2013.01); *H01L 2924/18165* (2013.01)

(56) References Cited

U.S. PATENT DOCUMENTS

| | | | |
|---|---|---|---|
| 2006/0166397 A1* | 7/2006 | Lau ....................... | H01L 21/561 438/106 |
| 2006/0220210 A1* | 10/2006 | Karnezos ............ | H01L 23/3135 257/686 |
| 2008/0211068 A1* | 9/2008 | Chen .................. | H01L 23/3107 257/666 |
| 2008/0217708 A1* | 9/2008 | Reisner ............... | H01L 23/3121 257/416 |
| 2008/0237310 A1* | 10/2008 | Periaman ................ | H01L 24/73 228/180.5 |
| 2012/0074585 A1* | 3/2012 | Koo ..................... | H01L 21/486 257/774 |

FOREIGN PATENT DOCUMENTS

| | | |
|---|---|---|
| JP | 5198697 | 8/1993 |
| JP | 645479 | 2/1994 |
| JP | 10189840 | 7/1998 |
| JP | 63306650 | 12/1998 |
| TW | 201336041 A1 | 9/2013 |
| TW | 201503268 A | 1/2015 |

* cited by examiner

PACKAGE STRUCTURE AND THREE DIMENSIONAL PACKAGE STRUCTURE

BACKGROUND OF THE INVENTION

1. Field of the Invention

The present invention relates to a package structure and a three dimensional (3D) package structure, and more particularly, to a package structure and a 3D package structure capable of reducing high frequency loss.

2. Description of the Prior Art

In general, high frequency or extremely high frequency mobile communication systems operate at an operating frequency which is higher than 10 GHz. The package technology in the prior art has significant loss when the operating frequency is higher than 10 GHz. For example, the common technology is surface mount technology (SMT). The components using SMT are mass produced and assembled as various mobile devices. However, the components using SMT in the prior art have poor high frequency properties. When the operating frequency is higher than 6 GHz, the frequency is more significant as the operating frequency increases, which degrades the performance.

In detail, FIG. 1 is a schematic diagram of a sectional side view of a package structure 10 in the prior art. The package structure 10 comprises a die 100 and leads 102. By a wire bonding process, the die 100 is connected to the leads 102 through metal wires 104. By a molding process, a molding cap 106 is formed to cover the die 100 and the metal wires 104. Notably, the metal wires 104 are covered within the molding cap 106. When an operating frequency is higher than 6 GHz, a parasitic inductive effect is formed since the metal wires 104 contact the molding cap 106. Further, the higher the operating frequency, the larger the inductance brought by the parasitic inductive effect. Hence, high frequency loss of the package structure 10 is larger and the performance of the package structure 10 is degraded.

Therefore, how to reduce high frequency loss is a significant objective in the field.

SUMMARY OF THE INVENTION

It is therefore a primary objective of the present invention to provide a package structure and a 3D package structure capable of reducing high frequency loss, to improve over disadvantages of the prior art.

The present invention discloses a package structure. The package structure comprises at least a lead, for delivering at least a signal; at least a routing layer, connected to the at least a lead, wherein at least a first hole, or a material capable of electrically conducting at least a lead frame of the package structure, is formed within the at least a routing layer; a die, disposed on the at least a routing layer, wherein at least a second hole is formed within the die, the die generates or receives the at least a signal, and the at least a signal is delivered between a first side and a second side of the die through the at least a second hole; and a molding cap, for covering the at least a routing layer and the die; wherein the at least a signal is delivered between the die and the at least a lead through the at least a first hole and the at least a second hole, or through the at least a lead frame.

The present invention further discloses a three dimensional (3D) package structure. The 3D package structure comprises at least a lead, for delivering at least a signal; at least a routing layer, connected to the at least a lead, wherein at least a first hole, or a material capable of electrically conducting at least a lead frame of the 3D package structure, is formed within the at least a routing layer; a plurality of dies, stacked with each other, disposed on the at least a routing layer, wherein at least a second hole is formed within at least a first die of the plurality of dies, and the at least a first die generates or receives the at least a signal; and a molding cap, for covering the at least a routing layer and the plurality of dies; wherein the at least a signal is delivered between the at least a first die and the at least a lead through the at least a first hole and the at least a second hole, or through the at least a lead frame.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
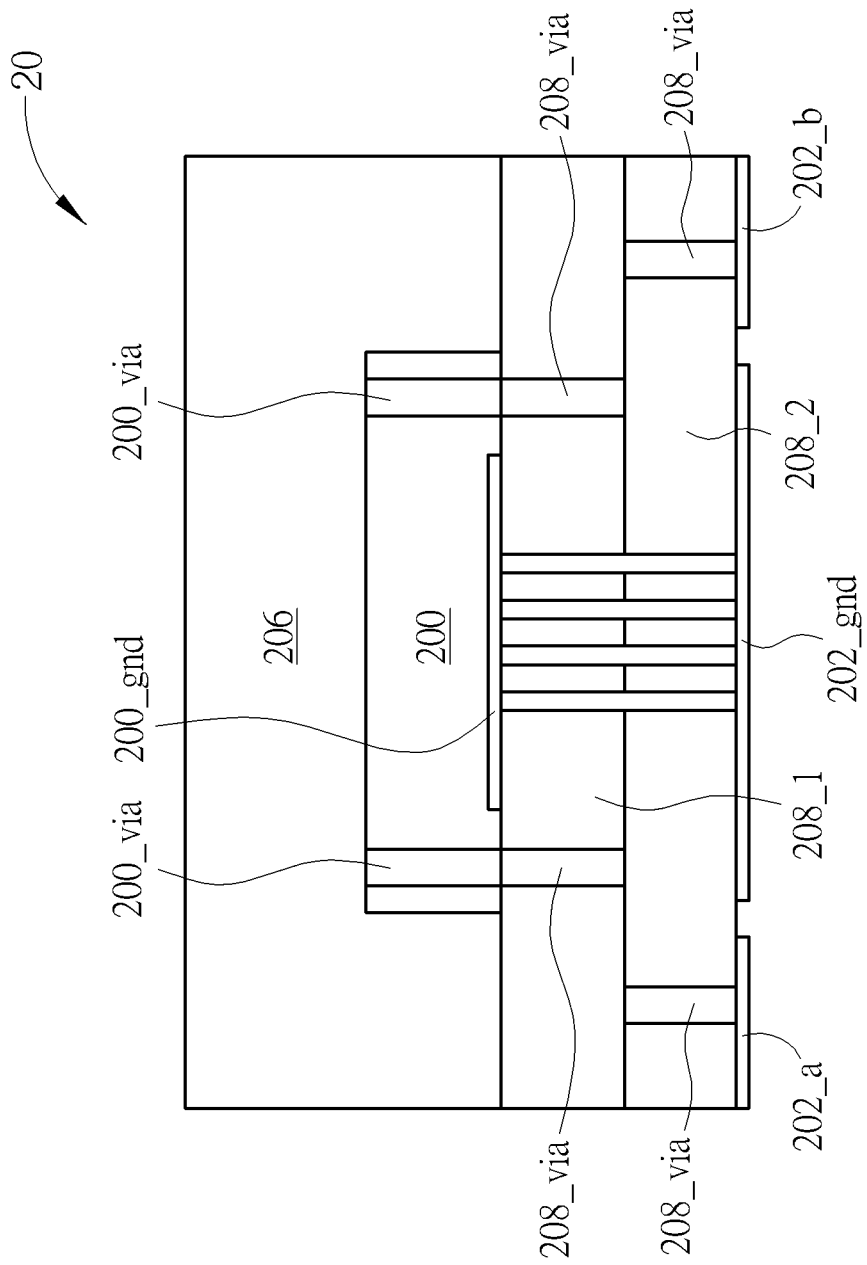
FIG. 2 is a schematic diagram of a sectional side view of a package structure according to an embodiment of the present invention.

FIG. 2 is a schematic diagram of a sectional side view of a package structure 20 according to an embodiment of the present invention. In the current embodiment, the package structure 20 is a quad flat no-lead package (QFN) comprising leads 202_1-202_N. The leads 202_1-202_N are disposed under the package structure 20. For brevity, FIG. 2 only illustrates two leads 202_a, 202_b among the leads 202_1-202_N. As shown in FIG. 2, the package structure 20 comprises a die 200, routing layers 208_1, 208_2, the leads 202_1-202_N and a molding cap 206. The die 200 is disposed on the routing layers 208_1, 208_2 to realize all the functions of a monolithic microwave integrated circuit (MMIC). In other words, the die 200 generates or receives a plurality of signals. The package structure 20 may be coupled to an external circuit board (not illustrated in FIG. 2) through the leads 202_1-202_N by welding. The leads 202_1-202_N are configured to deliver the plurality of signals between the die 200 and the external circuit board. Moreover, signals RF_a, RF_b are high frequency signals among the plurality of signals. In an embodiment, the leads 202_a, 202_b are configured to deliver the signals RF_a, RF_b to the external circuit board. The routing layers 208_1, 208_2 are electrically connected to the leads 202_1-202_N, disposed between the die 200 and the leads 202_1-202_N, and configured to provide routing between the die 200 and the leads 202_1-202_N. The molding cap 206 may be made of molding compound such as epoxy, air-cavity, etc., and not limited thereto. The molding cap 206 is configured to cover the routing layers 208_1, 208_2 and the die 200, such that an appearance of the package structure 20 is a QFN.

In detail, the plurality of holes 200_via may be formed inside the die 200 via a hot via process, and a plurality of holes 208_via may be formed inside the routing layers 208_1, 208_2 by drilling. The signals of the die 200 are passed through the holes 200_via from a top side of the die 200 (the side of the die 200 contacting the molding cap 206) to a bottom side of the die 200 (the side of the die 200 contacting the routing layer 208_1), and electrically connected to the holes 208_via inside the routing layer. In other words, the routing layers 208_1, 208_2 utilize conductive material such as microstrip line to provide routing between the die 200 and the leads 202_a, 202_b, through the holes 208_via. Therefore, in the current embodiment, the signals RF_a, RF_b are passed through the holes 200_via and the holes 208_via from the leads 202_a, 202_b to the die 200 (or from the die 200 to the leads 202_a, 202_b). In addition, the routing layers 208_1, 208_2 may be a laminate print circuit board (PCB). The routing layers 208_1, 208_2 may also be made of ceramic material, or conductive material conducting with a lead frame (not illustrated in FIG. 2) of the package structure 20, and not limited thereto. In addition, by the hot via process, a die-ground 200_gnd of the die 200 is electrically connected to a ground-lead 202_gnd of the package structure 20, such that the package structure 20 and the die 200 has better heat dissipation property.

Figure 1:
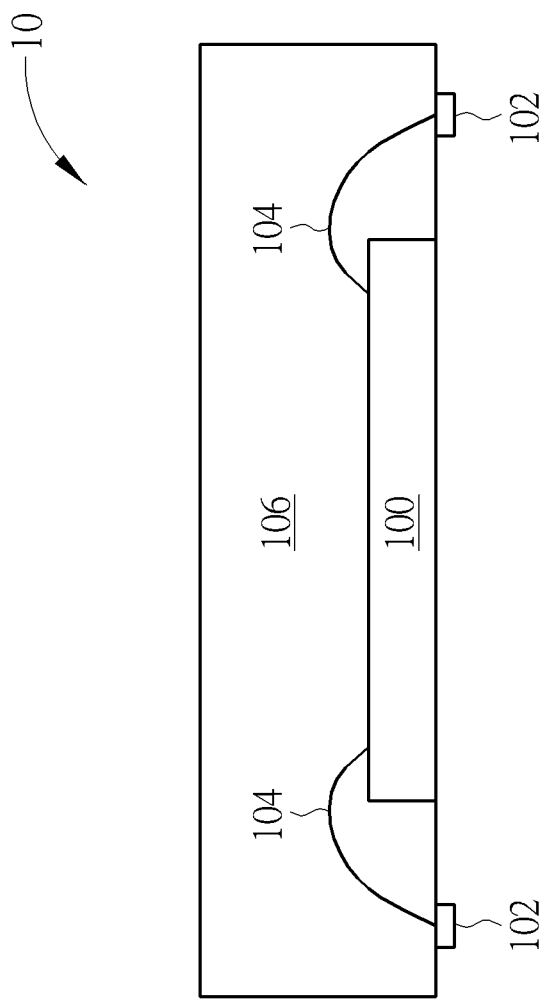
FIG. 1 is a schematic diagram of a sectional side view of a package structure in the prior art.
Figure 3:
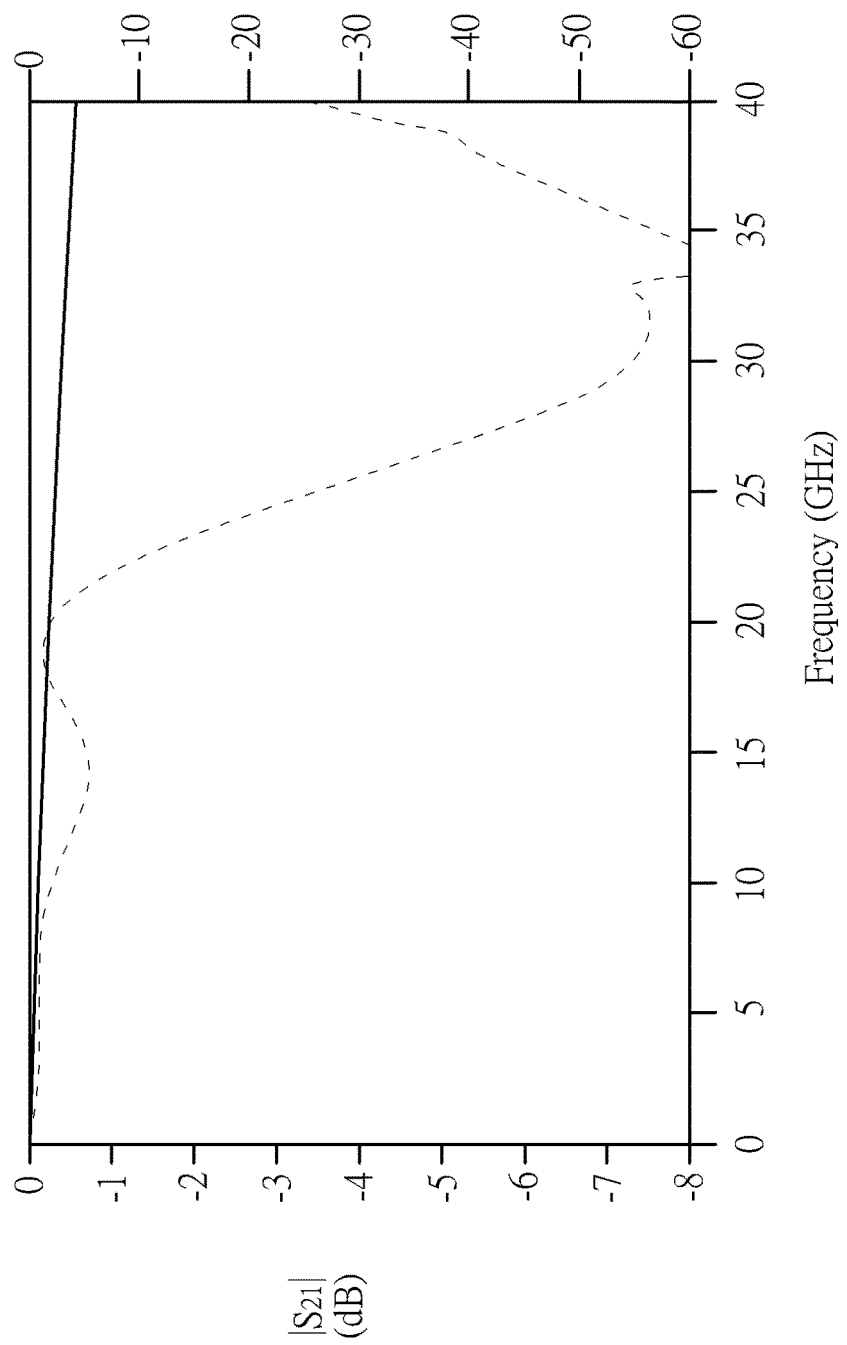
FIG. 3 is a frequency response diagram of transmission coefficient of the package structures in FIG. 1 and FIG. 2.

Notably, the high frequency signals RF_a, RF_b may electrically connected to the leads 202_a, 202_b through the holes 200_via, 208_via (or the lead frame). Thereby, the holes 200_via, 208_via of the present invention may replace the wire bonding method delivering the signals of the die to the leads of the package structure, so as to avoid unnecessary inductive effect. Thus, the package structure 20 would have rare (even no) parasitic inductive effect operating at high frequency (greater than 6 GHz). High frequency loss of the package structure 20 is significantly reduced. Please refer to FIG. 3, which is a frequency response diagram of transmission coefficient of the package structure 10 in FIG. 1 and the package structure 20 in FIG. 2, wherein the dashed line represents the frequency response of transmission coefficient of the package structure 10, and the solid line represents the frequency response of transmission coefficient of the package structure 20. As can be seen from FIG. 3, since the metal wires 104 contact the molding cap 106 in the package structure 10 in the prior art and the parasitic inductive effect is formed when the frequency is high, the transmission coefficient of the package structure 10 degrades drastically when the frequency is higher than 20 GHz, i.e., the loss of the package structure 10 is significant when the frequency is higher than 20 GHz. In comparison, even when the package structure 20 of the present invention operates at frequency higher than 20 GHz, the loss of the package structure 20 is extremely small, which is less than 1 dB.

Therefore, the package structure of the present invention may significantly reduce loss at high frequency. In addition, the package structure of the present invention may be applied to surface mount technology (SMT), which may be mass produced and assembled as various mobile devices. Furthermore, the present invention utilizes the hot via process to form the holes 200_via in the die 200. In comparison to the flip chip technology, there is no need to re-design a circuit layout of the die 200 to accommodate the wiring layout of the flip chip package. Also, the die 200 of the present invention has better heat dissipation property brought by the hot via process.

Figure 5:
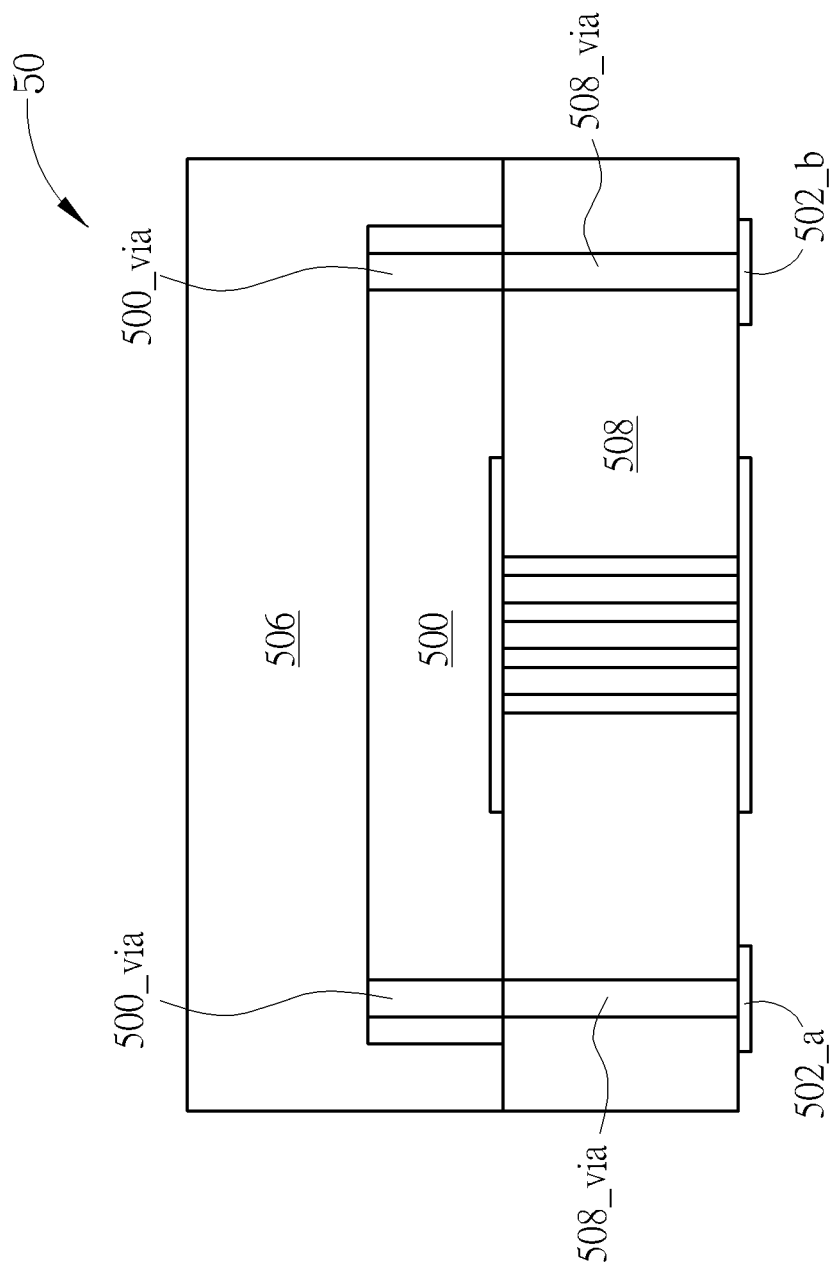
FIG. 5 is a schematic diagram of a sectional side view of a package structure according to an embodiment of the present invention.

Notably, the embodiments stated in the above are utilized for illustrating concepts of the present invention. Those skilled in the art may make modifications and alternations accordingly, and not limited herein. For example, in the package structure 20, an area of the die 200 is usually smaller than an area of the package structure 20, and performing vertical drilling on the laminate PCB is a well-known technology. Hence, vertical drilling may be performed on the two routing layers 208_1, 208_2 to deliver the signals RF_a, RF_b from the leads 202_a, 202_b to the die 200 (or from the die 200 to the leads 202_a, 202_b). Nevertheless, the package structure of the present invention is not limited to comprise two routing layers. The package structure may comprise only one routing layer. For example, FIG. 5 is a schematic diagram of a sectional side view of a package structure 50 according to an embodiment of the present invention. The package structure 50 is similar to the package structure 20. Different from the package structure 20, the package structure 50 comprises only one routing layer 508. Since a die 500 in the package structure 50 has an area larger than the die 200, a projection result of the die 500 overlaps with leads 502_a, 502_b. Hence, vertical drilling may be performed on the routing layer 508 to form the holes 508_via, to build routing between the die 500 and the leads 502_a, 502_b. Notably, the method forming the holes in the routing layer may be modified according to practical requirement, which may be formed by oblique drilling or curved drilling, and not limited thereto. In other words, as long as holes are formed in the routing layer to build connections between the die and the leads, the requirements of the present invention is met, which is under the scope of the present invention.

In another perspective, in the previous embodiment, the package structure 20 utilizes the holes to deliver the high frequency signals RF_a, RF_b between the die 200 and the leads 202_a, 202_b, which is not limited thereto. All of the signals generated or received by the die may be delivered by the holes formed in the die and the routing layer between the die and the leads. Alternatively, if some of the signals generated or received by the die are low frequency signals or direct current (DC) signals, then the high frequency signals may be delivered between the die and the leads through the hole and the remaining low frequency signals or DC signals may be delivered between the die and the leads via wires which are formed by the wire bonding process. That is, as long as one signal is delivered through the hole (s) in the die and the holes (s) in the routing layer, the requirements of the present invention are met, which is under the scope of the present invention.

In addition, the package structure 20 may be variation of QFN packages, e.g., power QFN (PQFN) package, thin QFN (TQFN) package, ultra thin QFN (UTQFN) package, extreme thin QFN (XQFN) package, etc., which are all under the scope of the present invention. In addition, the package structure 20 may also be dual flat no-lead (DFN) package and the variations thereof, e.g., power DFN (PDFN) package, thin DFN (TDFN) package, ultra thin DFN (UTDFN) package, extreme thin DFN (XDFN) package, etc., which are all under the scope of the present invention.

Figure 4:
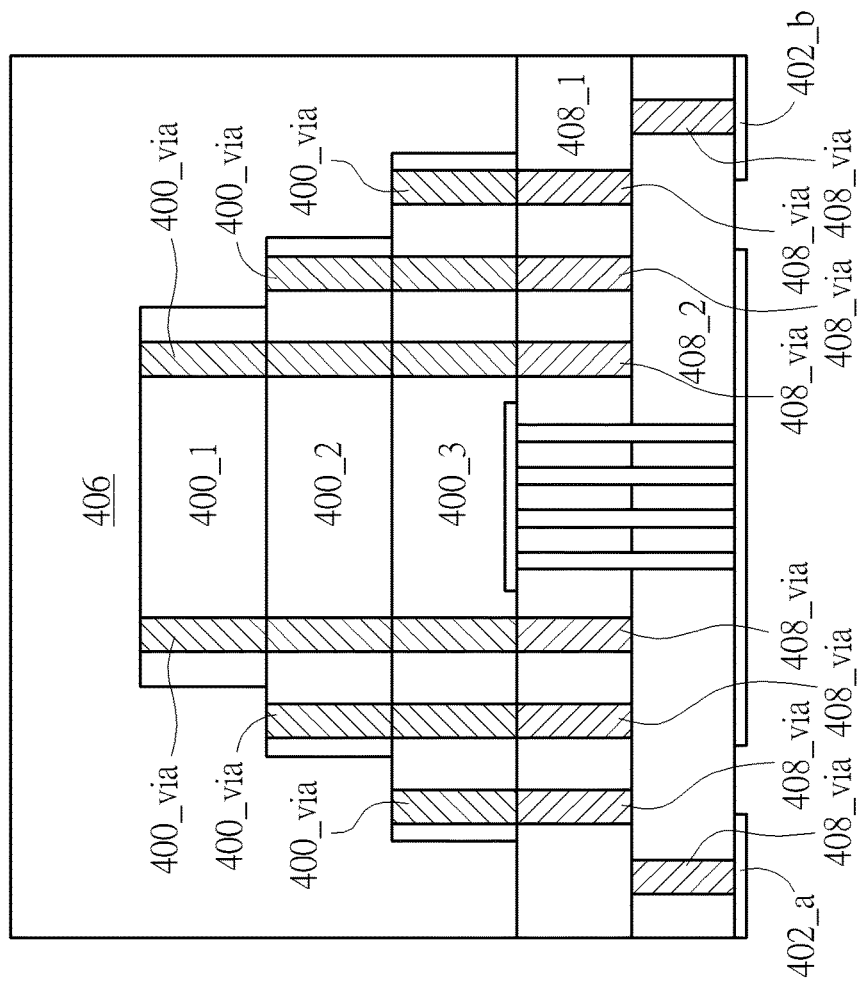
FIG. 4 is a schematic diagram of a sectional side view of a 3D package structure according to an embodiment of the present invention.

The package structure 20 illustrates an embodiment packing a single die in the package structure, wherein the high frequency loss is reduced. In addition, the present invention may be applied for packing multiple dies in the package structure. For examples, the dies may be stacked in a vertical direction, and a three dimensional (3D) package structure is formed. For example, FIG. 4 is a schematic diagram of a sectional side view of a 3D package 40 structure according to an embodiment of the present invention. The package structure 40 is a quad flat no-lead package (QFN) comprising leads 402_1-402_N. The leads 402_1-402_N are disposed under the package structure 40. As shown in FIG. 4, the 3D package structure 40 comprises dies 400_1-400_3, routing layers 408_1, 408_2 and a molding cap 406. For brevity, FIG. 4 only illustrates two leads 402_a, 402_b within the leads 402_1-402_N. The leads 402_a, 402_b are configured to deliver the signals RF_a, RF_b to the external circuit board. The routing layers 408_1, 408_2 are electrically connected to the leads 402_a, 402_b, disposed between the die 400_3 and the leads 402_a, 402_b. Holes 408_via are formed inside the routing layers 408_1, 408_2. The routing layers 408_1, 408_2 may be made of conductive material conducting with a lead frame (not illustrated in FIG. 4) of the package structure 40. The dies 400_1-400_3 are stacked with each other (i.e., the die 400_1 is disposed on a top of the die 400_2 and the die 400_2 is disposed on a top of the die 400_3) and disposed on the routing layer 408_1. Holes 400_via are formed inside the dies 400_1-400_3 by the hot via process. The dies 400_1-400_3 generate or receive the high frequency signals RF_a, RF_b. The molding cap 406 may be made of molding compound such as epoxy, aircavity, etc., and not limited thereto. The molding cap 406 is configured to cover the routing layers 408_1, 408_2 and the dies 400_1-400_3, such that an outward appearance of the package structure 40 is the same as a QFN. Therefore, the signals RF_a, RF_b are passed through the holes 400_via and the holes 408_via from the leads 402_a, 402_b to the dies 400_1-400_3 (or from the dies 400_1-400_3 to the leads 402_a, 402_b), i.e., the holes 400_via and the holes 408_via are utilized to provide routing between the dies 400_1-400_3 and the leads 402_a, 402_b. Notably, the 3D package 40 stated in the above is utilized for illustrating concepts of the present invention. Those skilled in the art may make modifications and alternations accordingly, and not limited herein. For example, a number of dies packed within the 3D package structure is not limited. The 3D package structure may comprise a plurality of dies. As long as the holes 400_via are formed by the hot via process in one die of the plurality of dies, the requirements of the present invention are satisfied, which is under the scope of the present invention. In addition, a number of the routing layers of the 3D package structure is not limited to be two. The 3D package structure may comprise only one routing layer. The holes in the routing layers may be formed by vertical drilling, oblique drilling, curved drilling, and not limited thereto. Other modification may be referred to related paragraph in the above, which is not narrated here for brevity.

In summary, the package structure of the present invention utilizes holes formed in the die and the routing layer to deliver high frequency signal, so as to avoid the signal path delivering high frequency signal contacting with the molding cap. Rarely (even no) parasitic inductive effect is formed. In comparison to the prior art, the package structure of the present invention has low high frequency loss, and is able to be applied to SMT, which may be mass produced and assembled as various mobile devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, wherein the package structure is a quad flat no-lead (QFN) package or a dual flat no-lead (DFN) package, the package structure comprising:
    at least a lead, for delivering at least a signal;
    a ground lead;
    a plurality of routing layers, disposed on the at least a lead and connected to the at least a lead, wherein a plurality of first holes are formed within the plurality of routing layers, the plurality of first holes comprise a plurality of inner first holes and a plurality of outer first holes, the plurality of inner first holes are formed within an upper routing layer of the plurality of routing layers, the plurality of outer first holes are formed within a lower routing layer of the plurality of routing layers and electrically connected to the at least a lead, and the plurality of inner first holes and the plurality of outer first holes are not vertically aligned;
    a die, comprising a die-ground underneath the die, disposed on the plurality of routing layers and electrically connected to the plurality of inner first holes, wherein at least a second hole is formed within the die, the die generates or receives the at least a signal, and the at least a signal is delivered between a first side and a second side of the die through the at least a second hole; and
    a molding cap, for covering the plurality of routing layers and the die;
    wherein the plurality of routing layers are disposed between the at least a lead and the molding cap, such that the molding cap has no contact with the at least a lead;
    wherein the at least a signal is delivered between the die and the at least a lead through at least a first hole among the plurality of first holes and the at least a second hole;
    wherein a plurality of grounding holes are formed within the plurality of routing layers, and the plurality of grounding holes penetrate through the plurality of routing layers;
    wherein the die-ground is electrically connected to the ground lead through the plurality of grounding holes;
    wherein projection results of the plurality of inner first holes onto a bottom surface of the package structure overlap with the ground lead.

2. The package structure of claim 1, wherein the plurality of routing layers are made of laminate printed circuit board (PCB) or a ceramic material.

3. The package structure of claim 1, wherein the at least a second hole is made by a hot via process.

4. The package structure of claim 1, wherein the molding cap is made of molding compound, or made by air-cavity packaging.

5. The package structure of claim 1, wherein the plurality of first holes penetrate through the plurality of routing layers.

6. A three dimension (3D) package structure, wherein package structure is a quad flat no-lead (QFN) package or a dual flat no-lead (DFN) package, the 3D package structure comprising:
    at least a lead, for delivering at least a signal;
    a ground lead;
    a plurality of routing layers, connected to the at least a lead, wherein a plurality of first holes are formed within the a plurality of routing layers, the plurality of first holes comprise a plurality of inner first holes and a plurality of outer first holes, the plurality of inner first holes are formed within an upper routing layer of the plurality of routing layers, the plurality of outer first holes are formed within a lower routing layer of the plurality of routing layers and electrically connected to the at least a lead, and the plurality of inner first holes and the plurality of outer first holes are not vertically aligned;
    a plurality of dies, stacked with each other, disposed on the plurality of routing layers, wherein at least a second hole is formed within at least a first die of the plurality of dies, and the at least a first die generates or receives the at least a signal; and a molding cap, for covering the plurality of routing layers and the plurality of dies;

wherein the plurality of routing layers are disposed between the at least a lead and the molding cap, such that the molding cap has no contact with the at least a lead;

wherein the at least a signal is delivered between the at least a first die and the at least a lead through at least a first hole among the plurality of first holes and the at least a second hole;

wherein a plurality of grounding holes are formed within the plurality of routing layers, and the plurality of grounding holes penetrate through the plurality of routing layers;

wherein a die of the plurality of dies comprises a die-ground underneath the die, the die-ground is electrically connected to the ground lead through the plurality of grounding holes, and the die is electrically connected to the plurality of inner first holes;

wherein projection results of the plurality of inner first holes onto a bottom surface of the 3D package structure overlap with the ground lead.

7. The 3D package structure of claim 6, wherein the plurality of routing layers are made of laminate printed circuit board (PCB) or a ceramic material.

8. The 3D package structure of claim 6, wherein the at least a second hole is made by a hot via process.

9. The 3D package structure of claim 6, wherein the molding cap is made of molding compound, or made by air-cavity packaging.

10. The 3D package structure of claim 6, wherein the plurality of first holes penetrate through the plurality of routing layers.

* * * * *